United States Patent
Wang et al.

(10) Patent No.: US 9,405,879 B2
(45) Date of Patent: Aug. 2, 2016

(54) CELL BOUNDARY LAYOUT

(71) Applicant: Taiwan Semiconductor Manufacturing Co., Ltd., Hsin-Chu (TW)

(72) Inventors: Yen-Sen Wang, Hsinchu (TW); Ting Yu Chen, Hsinchu (TW); Ken-Hsien Hsieh, Taipei (TW); Ming-Yi Lin, Hsinchu (TW); Chen-Hung Lu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 81 days.

(21) Appl. No.: 14/231,858

(22) Filed: Apr. 1, 2014

(65) Prior Publication Data
US 2015/0278428 A1 Oct. 1, 2015

(51) Int. Cl.
*G06F 17/50* (2006.01)
*G06F 9/455* (2006.01)

(52) U.S. Cl.
CPC ............ *G06F 17/5081* (2013.01); *G06F 9/455* (2013.01); *G06F 17/5068* (2013.01); *G06F 17/5072* (2013.01)

(58) Field of Classification Search
CPC ............ G06F 17/5081; G06F 17/5068; G06F 17/5072; G06F 9/455
USPC ........ 716/112, 119, 123, 136, 139, 52, 55, 54
See application file for complete search history.

(56) References Cited

U.S. PATENT DOCUMENTS

| | | | | |
|---|---|---|---|---|
| 6,083,275 A * | 7/2000 | Heng et al. | ...................... | 716/52 |
| 6,395,438 B1 * | 5/2002 | Bruce et al. | ...................... | 430/30 |
| 6,493,866 B1 * | 12/2002 | Mayhew | ...................... | 716/52 |
| 7,018,746 B2 * | 3/2006 | Cui et al. | ...................... | 430/5 |
| 7,415,694 B2 * | 8/2008 | Mayhew | ...................... | G03F 1/30 430/396 |
| 7,475,381 B2 * | 1/2009 | Davis | ...................... | G06F 17/5068 716/112 |
| 7,805,694 B2 * | 9/2010 | Regnier | ...................... | G06F 17/5022 716/122 |
| 8,448,100 B1 * | 5/2013 | Lin et al. | ...................... | 716/54 |
| 8,468,470 B2 * | 6/2013 | Hsu et al. | ...................... | 716/54 |
| 8,510,699 B1 * | 8/2013 | Acar et al. | ...................... | 716/119 |
| 8,601,411 B2 * | 12/2013 | Chen et al. | ...................... | 716/55 |
| 8,713,485 B2 * | 4/2014 | Brink et al. | ...................... | 716/52 |
| 8,732,626 B2 * | 5/2014 | Liu | ...................... | G06F 17/5068 716/50 |
| 8,782,576 B1 * | 7/2014 | Bowers et al. | ...................... | 716/55 |
| 8,799,836 B1 * | 8/2014 | Bickford et al. | ...................... | 716/102 |
| 8,850,367 B2 * | 9/2014 | Lai | ...................... | G06F 17/50 716/110 |
| 8,904,326 B2 * | 12/2014 | Huang et al. | ...................... | 716/112 |
| 8,943,454 B1 * | 1/2015 | Hsiao et al. | ...................... | 716/113 |
| 9,070,551 B2 * | 6/2015 | Bowers et al. | | |

(Continued)

*Primary Examiner* — Helen Rossoshek
(74) *Attorney, Agent, or Firm* — Eschweiler & Associates, LLC

(57) ABSTRACT

Some embodiments relate to a method of hierarchical layout design, comprising forming a layout of an integrated circuit (IC) according to a design rule that specifies a minimum design rule distance between a neighboring layout features within the IC. Forming the layout comprises forming first and second standard cells having first and second layout features, respectively, that about one-another so that a distance between the first and second layout features is less than the minimum design rule distance. The method further comprises configuring design rule checking (DRC) to ignore this fail. Instead, the layout is modified with an automated layout tool by merging the first and second layout features, or by removing a portion of the first or second layout feature to increase the distance between the first and second layout features to be greater than or equal to the minimum distance.

20 Claims, 8 Drawing Sheets

(56) References Cited

U.S. PATENT DOCUMENTS

| | | | | |
|---|---|---|---|---|
| 2005/0050501 A1* | 3/2005 | Allen et al. | | 716/10 |
| 2012/0124536 A1* | 5/2012 | Sharma | | 716/112 |
| 2013/0074018 A1* | 3/2013 | Hsu | G03F 1/70 | 716/55 |
| 2013/0087932 A1* | 4/2013 | Lu | H01L 27/11807 | 257/786 |
| 2013/0326445 A1* | 12/2013 | Brink | G06F 17/5081 | 716/112 |
| 2014/0264773 A1* | 9/2014 | Chang | G06F 17/5068 | 257/621 |
| 2014/0282344 A1* | 9/2014 | Hsu et al. | | 716/123 |
| 2014/0367760 A1* | 12/2014 | Bowers et al. | | 257/316 |
| 2015/0074627 A1* | 3/2015 | Huang et al. | | 716/107 |
| 2015/0317424 A1* | 11/2015 | Chang | G06F 17/5068 | 716/53 |

\* cited by examiner

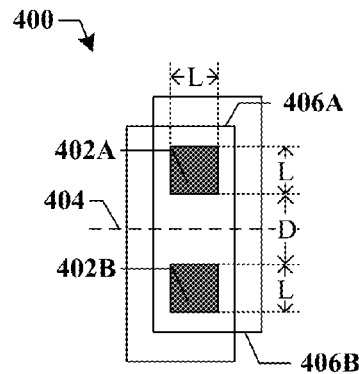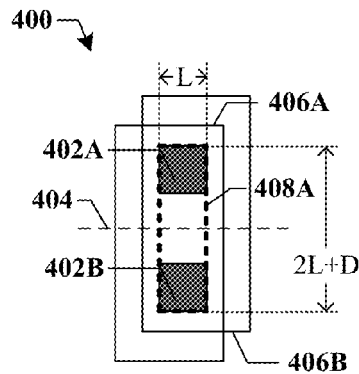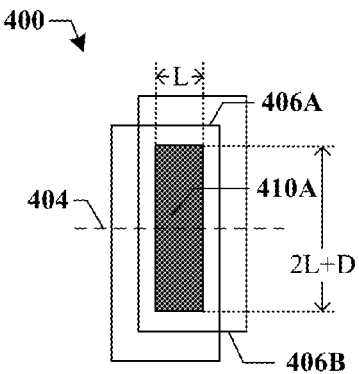
Fig. 4A  Fig. 4B  Fig. 4C
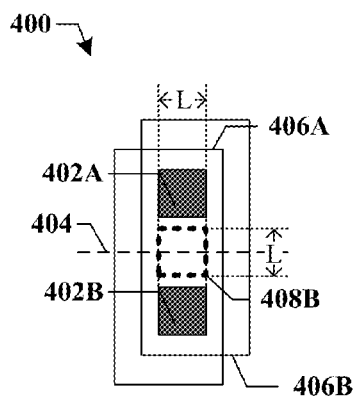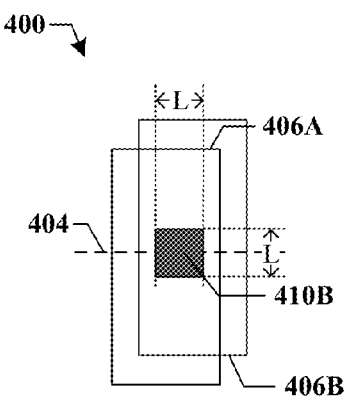
Fig. 4D  Fig. 4E
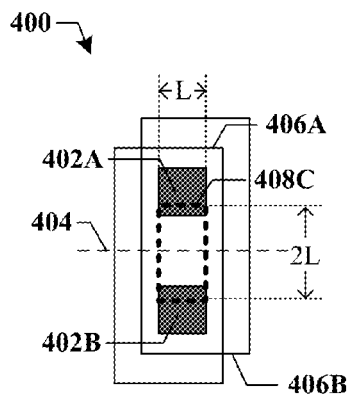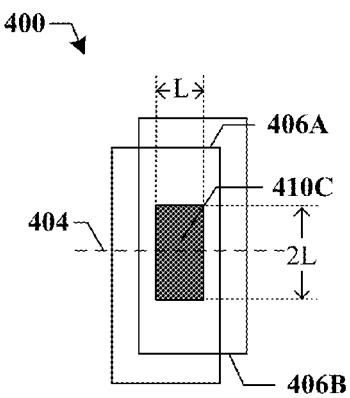
Fig. 4F  Fig. 4G

CELL BOUNDARY LAYOUT

BACKGROUND

The present disclosure relates to integrated circuit (IC) layout design. To design an IC with some desired functionality, an IC designer uses electronic design automation (EDA) tools. These computer-based EDA tools enable the IC designer to efficiently design an electronic version of the IC, which describes in detail how a large number of semiconductor devices are to be arranged on a semiconductor substrate. These semiconductor devices, such as transistors, diodes, capacitors, resistors, and the like, can be arranged individually or in combination to form standard cells. Memory cells, logic circuits, amplifiers, inverters, and the like, are just a few examples of standard cells. Standard cells, possibly along with custom (e.g., non-standard cells) are tiled together to realize the functionality desired by the IC designer. The physical organization of the IC in this electronic design space is referred to as the layout.

To ensure that designed shapes of the layout can be properly manufactured on an actual semiconductor substrate, a number of automated verification processes are performed during EDA design. One such process is design rule checking (DRC), which determines whether the electronic version of the IC layout satisfies a series of design rules. These design rules specify certain geometric and connectivity restrictions associated with a particular semiconductor manufacturing process. The design rules ensure sufficient margins to account for variability that is expected to be encountered when the IC layout is actually manufactured in a real-world semiconductor manufacturing processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1C, 2A-2C, 3A-3G, and 4A-4G illustrate some embodiments of automated layout modification.

DETAILED DESCRIPTION

Figure 1A:
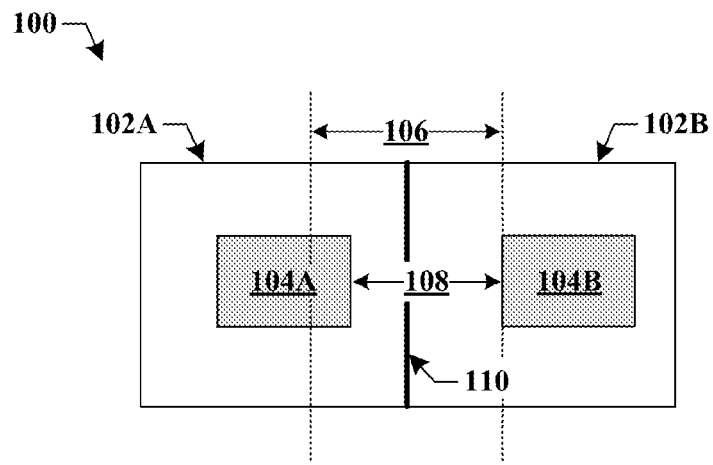

The following disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

An IC layout can include millions or even billions of devices, and is often formed by assembling a plurality of standard cells, which is typically performed by an autoplace-and-route tool but can also be manually performed in some instances. A standard cell can include an entire device, such as a transistor, diode, capacitor, resistor, or inductor, or can include a group of several devices arranged to achieve some particular function, such as an inverter, a flip-flop, a memory cell, or an amplifier, among others. In addition to making functional design easier to conceptualize, the use of standard cells can reduce verification time for design rule checking (DRC) of the layout features within the IC, because a standard cell that is repeated throughout the layout can be checked a single time in DRC rather than each instantiation being checked individually.

In a hierarchical layout scheme, a standard cell is designed and verified by DRC in a first level of design hierarchy. This standard cell and other similarly-verified standard cells can then be placed in a second, higher level of design hierarchy to implement higher functionality. For example, a standard cell in the form of an inverter can be DRC-checked and verified as a stand-alone inverter; and subsequently, multiple inverters can be instantiated with other standard cells in a second, higher level of hierarchical design to implement a digital counter. Within this second level of design hierarchy, standard cells can abut one another at their respective edges. To ensure that the abutment of two standard cells (which were individually verified at the first, lower hierarchical level) does not create a new DRC fail in the second, higher level of design hierarchy, typical DRC rules require that features within each standard cell for the first, lower hierarchical level are kept at least one-half the design rule minimum distance away from the standard cell boundary. In this way, whenever two standards cells are placed next to one another to abut in a higher level of the design hierarchy, the lower level layout features within the abutted standard cells satisfy the minimum space requirement across their boundary.

Unfortunately, keeping layout features at least one-half the design rule minimum distance away from the standard cell boundary can restrict the size of the layout feature within the cell as the layout is scaled. For layout features such as an active area of a transistor, if the scaling results in the active area being reduced, this reduction can limit drive current through the channel of the transistor. Similarly, for layout features that conduct such as gates or metallization layers, if the scaling results in the gates or metallization layers being reduced, this can undesirably increase the resistivity for these layers and degrade performance of the IC.

Accordingly, some embodiments of the present disclosure relate to a method of hierarchical layout design. In this method, an electronic integrated circuit (IC) layout is designed according to a design rule that specifies a minimum design rule distance between a pair of layout features within the IC. Within this electronic IC layout, first and second standard cells, which have first and second layout features, respectively, are arranged to abut one another so that a distance between the first and second layout features is less than the minimum design rule distance. Rather than design rule checking (DRC) providing an DRC error message regarding this apparent DRC violation, an automated layout tool forms an additional block between the first and second layout features to effectively merge the first and second layout features, or alternatively removes a portion of the first or second layout feature, in order to increase the distance between the first and second layout features to be greater than or equal to the minimum distance. Consequently, the active areas and/or resistive of a semiconducting device formed in a boundary region between the first and second standard cells can be made to scale with the size of the standard cell.

Figure 1B:
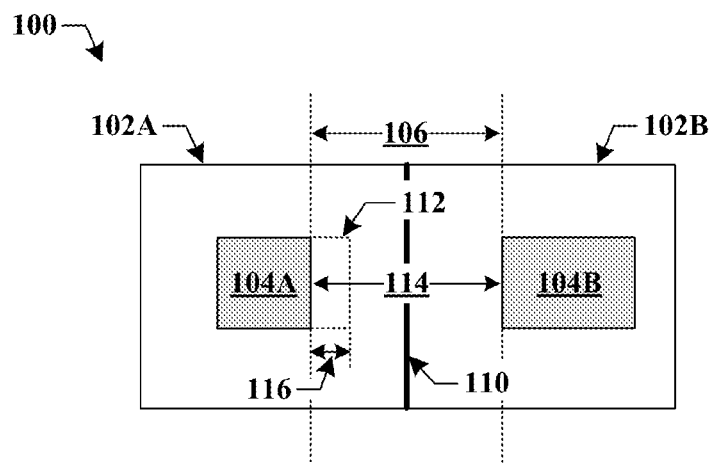
Figure 1C:
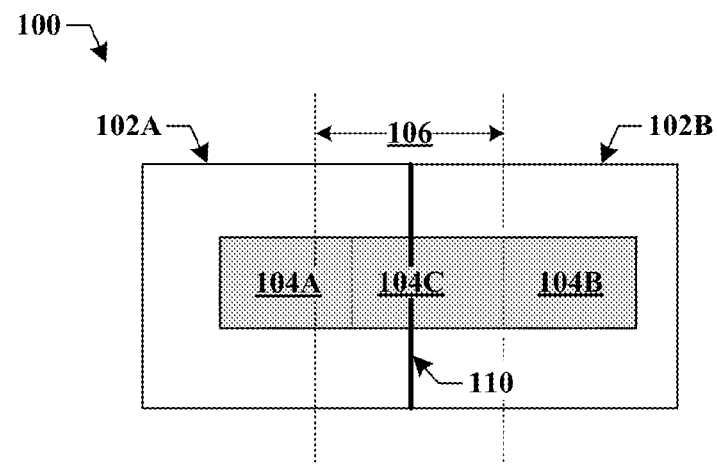

FIGS. 1A-1C illustrate some embodiments of automated layout modification. FIG. 1A illustrates a portion of an electronic version of an initial IC layout 100. The initial IC layout 100, which can be stored in computer memory, is formed using an electronic design automation (EDA) design window to create a graphical representation (e.g., GDSII, GL1, OASIS, etc.) of the layout 100. The EDA tool includes DRC software, which includes a design rule that specifies a minimum distance 106 between neighboring layout features. Thus, in FIG. 1A, the initial IC layout 100 includes first and second standard cells 102A, 102B. The first and second standard cells 102A, 102B have outer edges that circumscribe first and second features 104A, 104B, respectively. Notably, when initially laid out in the design, the first and second standard cells 102A, 102B abut one-another so that a distance 108 between neighboring edges of the first and second layout features 104A, 104B is less than the DRC-required minimum distance 106 across a boundary 110 between the first and second standard cells 102A, 102B.

FIG. 1B illustrates a modified version of the initial layout 100, wherein modified version of the initial layout 100 of FIG. 1A has been modified with an automated design tool configured to recognize the sub-minimum distance 108, and to remove a portion 112 of the first layout feature 104A, so that a modified distance 114 between the first and second layout features 104A, 104B is greater than or equal to the minimum distance 106. Equivalently, an "end" of the first layout feature 104A can be "pulled back" by an amount 116 that is greater than a difference between the minimum distance 106 and the sub-minimum distance 108. Additionally, while only a portion of the first layout feature 104A was removed (or pulled back) in FIG. 1B, other embodiments may include the removal of only a portion of the second layout feature 104B, or the removal of portions of both the first and second layout features 104A, 104B.

FIG. 1C illustrates the layout 100, wherein layout 100 has been modified with an automated design tool configured to recognize the sub-minimum distance 108, and to merge the first and second layout features 104A, 104B, by forming a connection region 104C that eliminates the subminimum distance 108. For the embodiments of FIG. 1C, the automated design tool determines whether merging of the first and second layout features 104A, 104B will result in an unintended electrical short within the layout before the merging can occur.

Figure 2A:
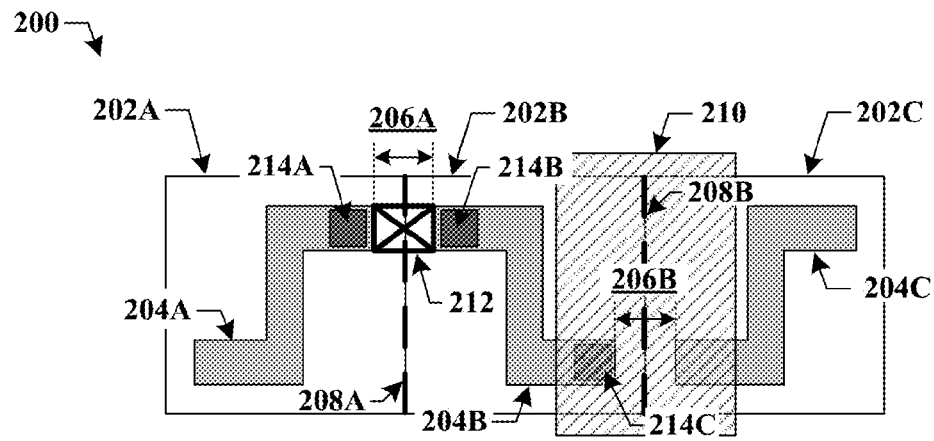
Figure 2B:
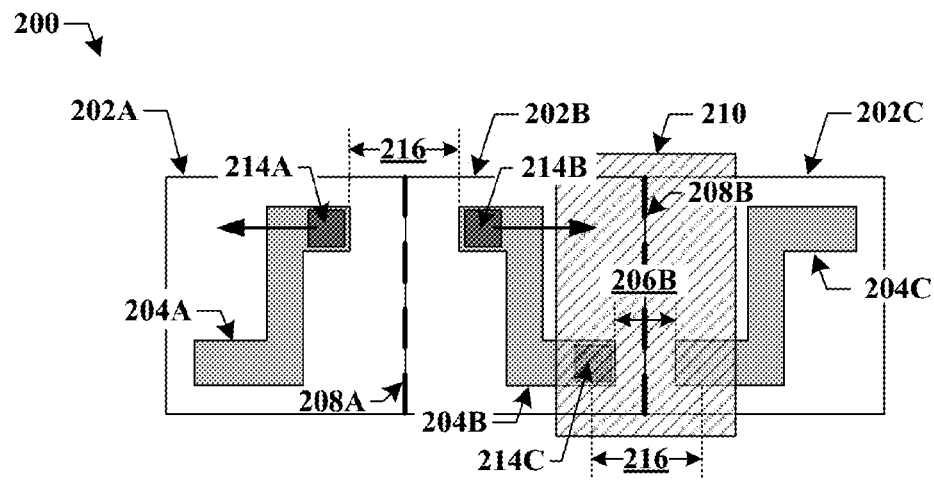
Figure 2C:
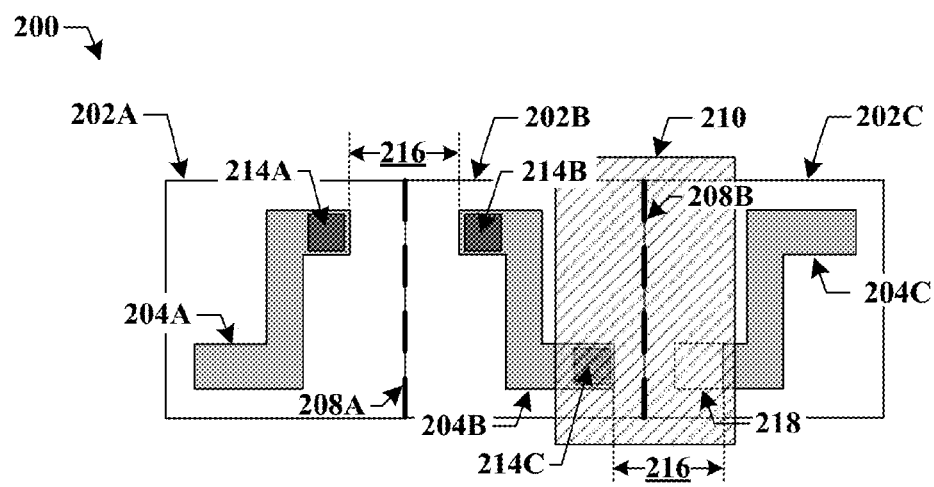

FIGS. 2A-2C illustrate some embodiments of a method of synergizing an automated layout modification with DRC to prevent unintended effects. In FIG. 2A a layout 200 is formed. The layout includes first-third standard cells 202A-202C that abut one another, so that the first and second layout features 204A, 204B form a first subminimum space 206A across a first boundary 208A between the first and second standard cells 202A, 202B. Likewise, second and third layout features 204B, 204C form a second subminimum space 206B across a second boundary 208B between the second and third standard cells 202B, 202C. These subminimum spaces 206A and 206B are less than a DRC-required minimum distance across a boundary between the first and second standard cells.

The first-third layout features 204A-204C are formed on a first design layer corresponding to a manufactured shape (e.g., a polysilicon gate, oxide, metal wire, contact, etc.) within the IC, and are formed within an EDA design window.

The EDA design window is coupled to a layout verification tool configured to perform DRC checking on the layout 200 against one or more design rules. The layout verification tool is also configured to suppress identification of design rule fails in regions of the layout that are covered by the marker shape 210, which is formed on a second design layer that does not correspond to a manufactured shape.

A DRC of the layout 200 by the layout verification tool flags a first subminimum space 206A with an error shape 212, which prompts a layout designer using the EDA design window to manually fix the first subminimum space 206A. However, the second subminimum space 206B is not flagged, because ends of the second and third layout features 204B, 204C are covered by the marker shape 210 that straddles the second boundary 208B.

FIG. 2B illustrates the an edited version of layout 200, wherein the layout designer has manually fixed the first subminimum space 206A by removing or "pulling back" ends of first and second layout features 204A, 204B to increase the first subminimum space 206A to greater than or equal to the design rule minimum distance 216. The manual fix also includes shifting of first and second contacts 214A, 214B that are formed to the first and second layout features 204A, 204B. Without shifting the first and second contacts 214A, 214B, pulling back portions of first and second layout features 204A, 204B would uncover the first and second contacts 214A, 214B, resulting in a loss of contact area, higher contact resistance, and possible loss of yield. The second subminimum space 206B is not fixed in FIG. 2B because the second and third layout features 204B, 204C are covered by the marker shape 210. The second subminimum space 206B will be fixed in an automated layout modification step in FIG. 2C.

For a hierarchical layout 200, wherein the first-third standard cells 202A-202C are initially formed as individual standard cells at a first level of hierarchy, and tiled together with one another on a second level of hierarchy which is above the first, the manual fix includes disassembly of the layout 200 at the second level of hierarchy, and reassembly after the first-third standard cells 202A-202C have been fixed at the first level of hierarchy. This manual fix results in additional layout design overhead. In addition to the disassembly and reassembly, DRC is be performed on the first and second standard cells 202A, 202B at the first level of hierarchy, and again at the second level of hierarchy after the layout 200 has been reassembled. Additionally, other automated verification processes such as layout vs. schematic (LVS) and parasitic extraction is re-run. It is therefore not desirable to perform a manual fix if an automated fix can be used to avoid this additional overhead.

In FIG. 2C, the layout 200 of FIG. 2B is modified by an automated layout tool to remove the second subminimum space 206B. The second layout feature 204B contains a third contact 214C that would be uncovered if ends of the second and third layout features 204B, 204C were pulled back equally. Therefore, the automated layout tool is configured to recognize the presence of the third contact 214C, and to remove only a portion of the third layout feature 204C to increase the second subminimum space 206B to be greater than or equal to the design rule minimum distance 216.

The design rules that govern placement of layout features within a graphical representation of a layout are defined with advanced knowledge of how automated layout modification will occur, otherwise the layout modification can have unintended consequences that may result in a loss of yield from the IC by creating opens or shorts, or by reducing design margin by narrowing layout features, reducing contact enclosure, etc.

The automated layout tool discussed in FIGS. 2A-2C is configured to prevent unintended results during the automated layout modification step. In addition to not creating catastrophic results like opens of shorts, the automated layout tool can be configured to operate in conjunction with DRC checking to avoid the creation of new design rule fails. This can be achieved in several ways. One method is to run DRC before and after the automated layout modification and automatically undo any layout changes that cause new DRC fails. Another method is to account for the worst-case layout correction when constructing the design rules. As a non-limiting example, a manufacturing requirement may state that a metal should enclose a contact to which it connects on all sides by 10 nm to ensure adequate contact resistance (i.e., intersect area) after a process variation of two or more standard deviations from the mean (e.g., mask overlay error). Additionally, the automated layout modification might remove at most 20 nm of metal (i.e., "pull backs" the metal ends by 20 nm). The design rule can be crafted to require 30 nm of enclosure, so that the minimum 10 nm requirement is always met even after the automated layout modification.

Figure 3A:
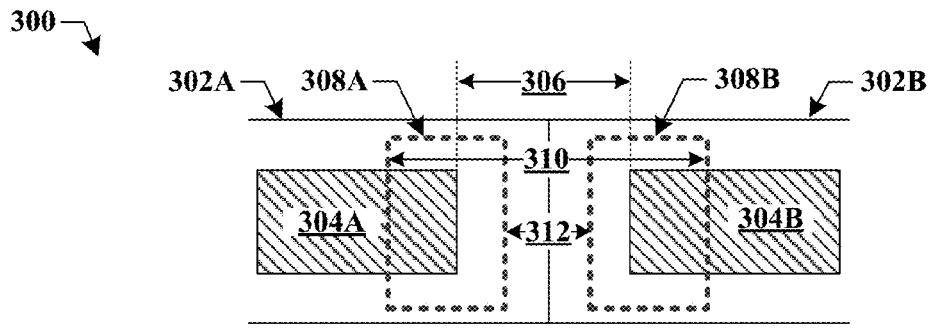

FIG. 3A illustrates a border region 300 between first and second standard cells 302A, 302B that contains first and second layout features 304A, 304B, which are, for example metal_0 lines, and which are formed at a first subminimum space 306 to one-another. First and second cut mask shapes 308A, 308B are added within each standard cell 302A, 302B, so a portion of each of the first and second layout features 304A, 304B are removed to increase the first subminimum space 306 to a DRC legal space 310. However, due to abutting the first and second standard cells 302A, 302B the first and second cut mask shapes 308A, 308B form a second subminimum space 312 to one another, and therefore cannot be formed on the same cut mask.

Figure 3B:
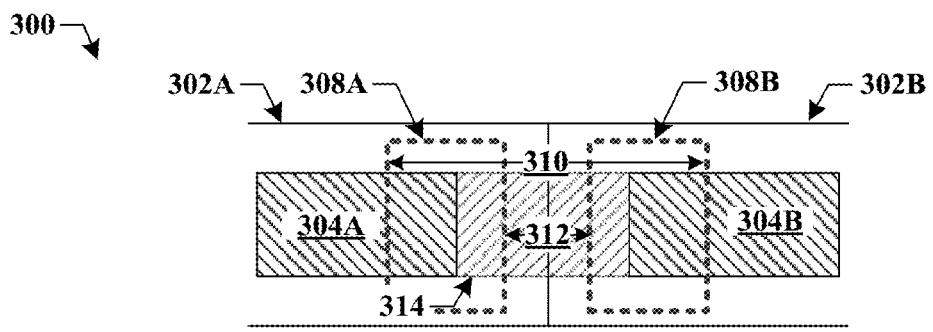

In FIG. 3B, a blocking marker 314 has been added to the border region 300. The blocking marker 314, which is formed in a different design layer than the first and second layout features 304A, 304B, has ends that abut the neighboring ends of the first and second layout features 304A, 304B. Although this blocking layer 314 is in a different design layer than the first and second layout features 304A, 304B, during mask manufacture, the blocking layer 314 is merged with the metal_0 design layer to merge the first and second layout features 304A, 304B. For this reason, even though the metal_0 lines 304A, 304B initially have ends that have the first subminimum space 306, the blocking layer 314 prevents these features from flagging a DRC violation, as the merged lines can be accurately manufactured as a single shape.

Figure 3C:
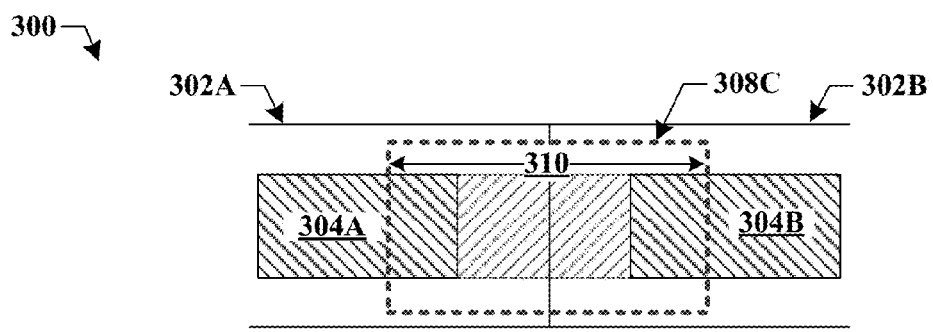
Figure 3D:
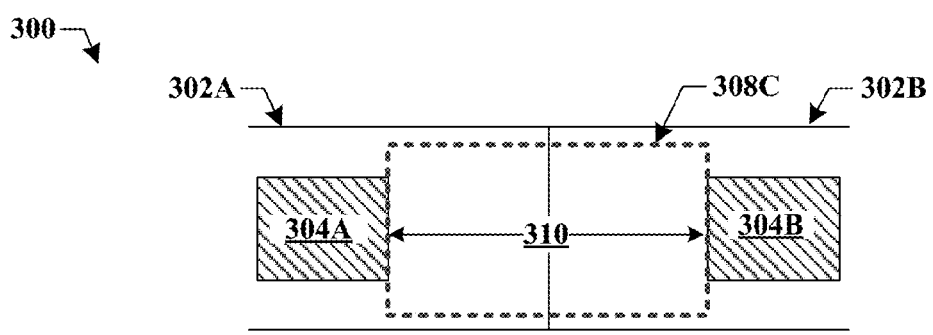

In FIG. 3C, first and second cut mask shapes 308A, 308B are merged into a single, third cut mask shape 308C, comprising a least enclosing rectangle (LER) of the first and second cut mask shapes 308A, 308B. Therefore, in order to ensure that the first and second metal_0 lines 304A, 304B are subsequently separated from one another, thereby avoiding inadvertent shorts, the third cut mask shape 308C is configured to remove any portion of the first and second layout features 304A, 304B that it overlaps. In particular, third cut mask shape 308C has an edge that pushes edges of the metal_0 lines back such that the DRC legal space 310 is met between ends of the metal_0 lines, as illustrated in FIG. 3D.

In some embodiments, the blocking layer 314 and third cut mask shape 308C are added at a unit level of layout hierarchy, which is above the standard cell level of hierarchy, thus avoiding the overhead of fixing the first and second standard cells 302A and 302B at the standard cell level of hierarchy.

Figure 3E:
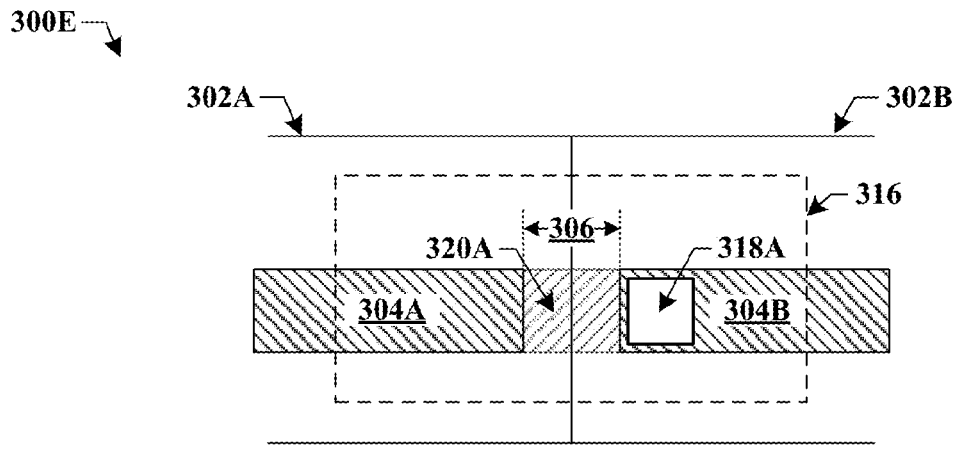

FIG. 3E illustrates a border region 300E between first and second standard cells 302A, 302B that contains first and second layout features 304A, 304B, which are formed at the first subminimum space 306 to one-another. The border region 300E is covered by a marker shape 316, which may comprise a designed layer such as a metal_1 power bus, or a layer that is not manufactured. The second layout feature 304B connects to a first contact 318A. For the embodiments of FIG. 3E, the automated layout modification is configured to not remove portions of layout features covered by a contact. Therefore, the automated layout modification cannot simply "pull back" facing edges of the first and second layout features 304A, 304B, or simply add a cut shape that removes equal portions of the first and second layout features 304A, 304B. However, because the first layout feature 304A does not touch a contact, the automated layout modification can merge it with the second layout feature 304B without creating a short. The automated layout modification therefore adds a first merge feature 320A that is formed on the same design level (i.e., metal_1) as the first and second layout features 304A, 304B, and which merges them into a single shape. In some embodiments, the first merge feature 320A can again be added at the unit level of hierarchy.

Figure 3F:
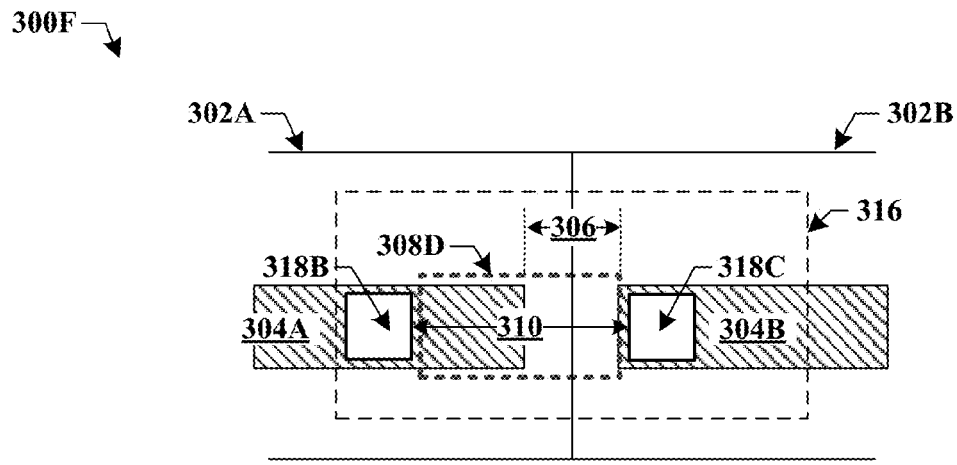

FIG. 3F illustrates a border region 300F between first and second standard cells 302A, 302B that contains first and second layout features 304A, 304B, which are formed at the first subminimum space 306 to one-another. The first and second layout features 304A, 304B contact second and third contacts 318B, 318C, respectively. To ensure that one or both edges of the first and second layout features 304A, 304B can be pulled back, first design rule has been added, which requires a distance between the second and third contacts 318B, 318C to be greater than or equal two the DRC legal space 310 between the first and second layout features 304A, 304B. As a result, portion(s) of the first and second layout features 304A, 304B can be removed without uncovering the second or third contacts 318B, 318C. A fourth cut mask shape 308D is appropriately added at the unit level of hierarchy to achieve the DRC legal space 310.

Increasing the space between contacts is one way to mitigate against loss of contact area when pulling back edges of layout features that connect to the contacts. However, this strategy can be overly conservative because the larger space may not be needed. Another strategy to avoid loss of contact area, without unnecessarily sacrificing layout area with overly-conservative design rules, is to merge both the contacts and layout features to which they connect.

Figure 3G:
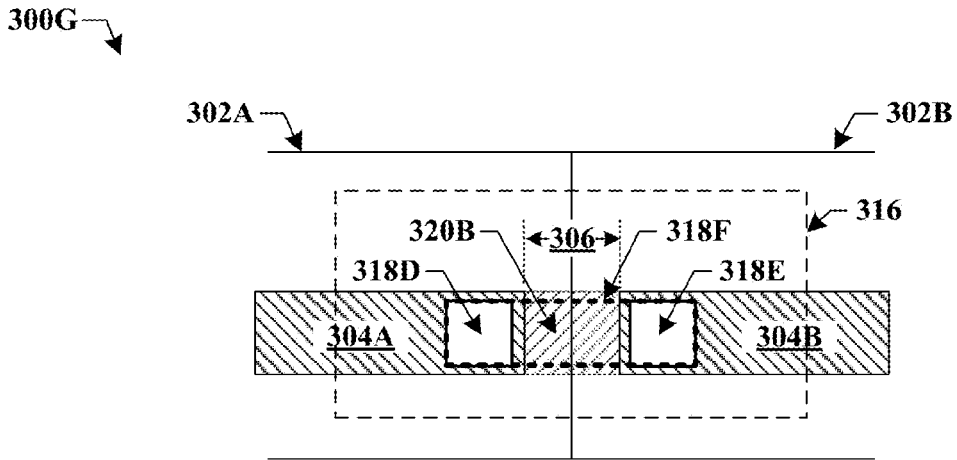

FIG. 3G illustrates a border region 300G between first and second standard cells 302A, 302B that contains first and second layout features 304A, 304B, which are formed at the first subminimum space 306 to one-another. The first and second layout features 304A, 304B contact fourth and fifth contacts 318D, 318E, respectively. In this instance, a second design rule is added, which is an exception to the first design rule of FIG. 3F, and allows for contacts at a distance of less than the DRC legal space 310 if they both touch the same marker shape 316, and that marker shape 316 comprises a layout feature. For the embodiments of FIG. 3G, the marker shape 316 is formed on metal_1, such that the first and second layout features 304A, 304B are already electrically connected. As a result, the automated layout modification is configured to merge the first and second layout features 304A, 304B because they both connect to the same metal_1 shape through the fourth and fifth contacts 318D, 318E. To achieve this, a second merge feature 320B is added to merge the first and second layout features 304A, 304B into a single shape (e.g., on the metal_0 level). Due to the additional metal added by the second merge feature 320B, the fourth and fifth contacts 318D, 318E can also be merged into a first replacement contact 318F. Replacement contact strategies will be described in detail in the embodiments of FIGS. 4A-4G.

FIGS. 4A-4G illustrate some replacement contact strategies. FIG. 4A illustrates a layout 400 comprising a pair of contacts 402A, 402B formed at subminimum distance (D) across a cell boundary 404. The pair of contacts 402A, 402B are square with an area (L×L), and contact a first layout feature 406A that is directly below the pair of contacts 402A, 402B in the cross-sectional device stack of the IC. Likewise, the pair of contacts 402A, 402B also connect to a second layout feature 406B that is directly above the pair of contacts 402A, 402B in the device stack.

For the embodiments of FIGS. 4A-4G, the automated layout modification is configured to merge contacts formed to a single layout feature above or below the contacts as defined by the device stack of the IC. In FIG. 4B, a least enclosing rectangle (LER) 408A is formed around the pair of contacts 402A, 402B by the automated layout tool, which determines that the LER 408A is completely covered by the first and second layout features 406A, 406. In FIG. 4C the pair of contacts 402A, 402B are replaced by a first replacement contact 410A.

For FIG. 4A, the original contact area of the pair of contacts 402A, 402B of 2(L×L) was increased to 2((L)×(L+D), an increase of (D×L). This would have an effect of decreasing the total contact resistance in the intersection between the first and second layout features 406A, 406 by 1/(D×L), which is typically desirable from a layout standpoint. However, on other situations it may be desirable to maintain contact area, or even achieve a "unit contact area" (i.e., single contact area) within the intersection.

In FIG. 4D a unit area square (UAS) 408B is formed between the pair of contacts 402A, 402B of FIG. 4A by the automated layout tool, which has the area of a single contact (L×L). In FIG. 4E the pair of contacts 402A, 402B are replaced by a second replacement contact 410B with an area (L×L) of a single contact.

Alternatively, in FIG. 4F a double area rectangle (DAR) 408C is formed between the pair of contacts 402A, 402B of FIG. 4A by the automated layout tool, which has the area of a two contacts (2L×L), and which partially overlaps each of the pair of contacts 402A, 402B. In FIG. 4G the pair of contacts 402A, 402B are replaced by a third replacement contact 410C with an area (2L×L) of two contacts.

For the embodiments of FIGS. 4A-4G, the automated layout tool can produce the first-third replacement contacts 410A-410C by merging the pair of contacts 402A, 402B together and removing portions of the merged contact, so that the resulting merged shape comprises an area of a single contact, or a total combined area the pair of contacts 402A, 402B. The merging and removing can again take place hierarchically. The pair of contacts 402A, 402B can be merged by adding the LER 408A on the same design level (i.e., first metal level), which covers them both. Portions of the merged shape (410A) could then be removed by adding a cut shape, or multiple cut shapes. Boolean operations could also be used to merge and/or ignore shapes or portions of shapes in the mask build process to avoid additional mask patterning steps in manufacturing.

Figure 5:
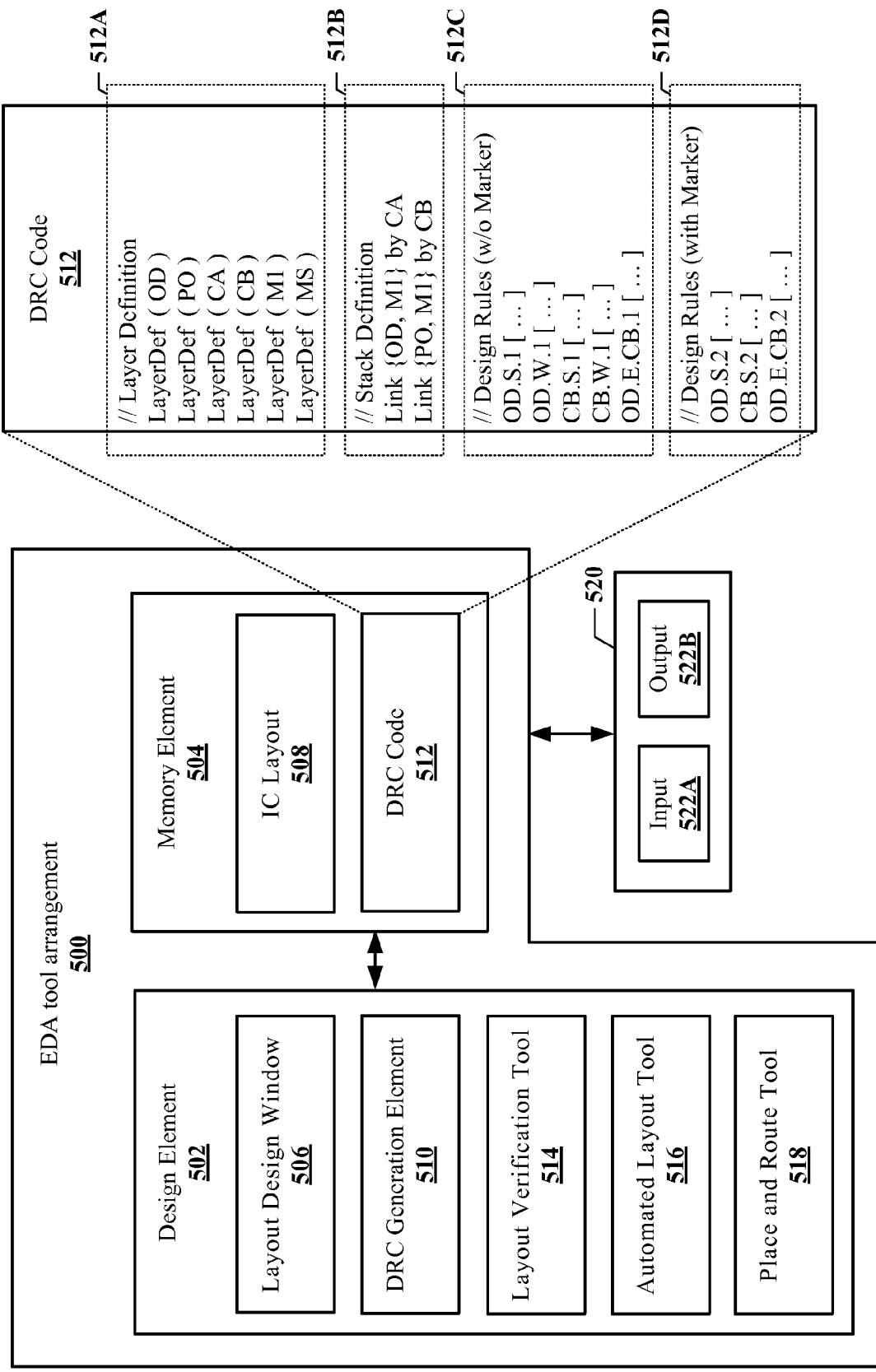
FIG. 5 illustrates a block diagram of some embodiments of an electronic design automation (EDA) tool arrangement configured for automated layout modification.

FIG. 5 illustrates a block diagram of some embodiments of an electronic design automation (EDA) tool arrangement 500 configured for automated layout modification. The EDA tool arrangement 500 comprises a design element 502 and a memory element 504. In various embodiments, the memory element 504 may comprise an internal memory or a computer readable medium. The design element 502 comprises a layout design window 506, such as a such as a CADENCE VIRTUOSO or MENTOR GRAPHICS layout design window, configured to create a graphical representation of an IC 508 (e.g., a GDS or GDSII file, a CIF file, a GL1 file, or an OASIS file), which is stored in the memory element 504. The design element 502 further comprises a design rule check (DRC) generation element 510 configured to generate DRC code 512, which is stored in the memory element 504.

The DRC code 512 contains one or more design rules, which individually check design layers of the graphical representation of an IC 508. In some embodiments, the DRC code 512 is configured to individually check first and second sets of design rules 512C, 512D depending on the presence of a marker shape (MS), which specify different geometrical requirements for placement of layout features within the graphical representation of the IC 508. For instance, the first set of design rules 512C are checked in areas of the graphical representation of an IC 508 not covered by MS, and the second set of design rules 512D are checked in areas covered by MS.

The first set of design rules 512C may contain a first distance check (OD.S.1) that specifies a minimum distance between two or more active area shapes, and a first active area width check (OD.W.1) that specifies a minimum width of an active area shape. Similar distance and width checks can be defined for an active area contact (CB.S.1, CB.W.1). Other types of checks can specify contact enclosure of an active area contact within the active area to which it connects (OD.E.CA.1). The first set of design rules 512C assume no automated layout modification because they are checked outside the marker shape (MS). The second set of design rules 512D (OS.S.2, CB.S.2, OD.E.CB.2) are checked under MS, and are relaxed compared to the first set of design rules 512C because they do assume an automated layout modification.

As a non-limiting example, OD.S.1 may require a minimum distance of 100 nm between active area shapes for manufacturing, but OD.S.2 may only require 60 nm. The automated layout modification could therefore remove as much as a 40 nm wide portion from a single active area shape covered by MS to meet the minimum 100 nm manufacturability requirement. Consequently, if OD.E.CA.1 requires an active area contact to be enclosed by at least 10 nm on all sides, OD.E.CA.2 may require an enclosure of at least 50 nm. In order to relieve an overly restrictive OD.E.CB.2 requirement, CB.S.2 may be increased by 40 nm under the marker shape to make sure that the active area contact is not uncovered by an automated layout modification to the active area.

The DRC code 512 also comprises a layer definition 512A, which defines individual design layer definitions within the DRC code 512. The DRC code 512 further comprises a stack definition 512B, which defines information about electrical connections between and/or within the design layers of the layer definition 512A.

The design element 502 further comprises a layout verification tool 514, coupled to the layout design window 506, and configured to verify whether the graphical representation of the IC 508 satisfies the first and second sets of design rules 512C, 512D. The layout verification tool 514 is further configured to report fails to the first set of design rules 512C to the layout design window 506 for layout features that are not covered by MS, and to report fails to the second set of design rules 512D to the layout design window 506 for layout features that are covered by MS. However, the layout verification tool 514 does not report fails to the first set of design rules 512C for layout features covered by MS to the layout design window 506. Instead, the layout verification tool 514 reports those fails to an automated layout tool 516.

The automated layout tool 516 is coupled to the layout design window 506 and to the layout verification tool 514. The automated layout tool 516 is configured to modify layout features of the graphical representation of the IC 508 by performing the operations discussed in the embodiments of FIGS. 1A-1C, 2A-2C, 3A-3G, and 4A-4G. A place and route tool 518 configured to generate configured to selectively route design shapes on a plurality of design levels of the graphical representation of the IC 508 according to the first and second sets of design rules 512C, 512D.

The EDA tool arrangement 500 further comprises a user interactive design environment 522 that allows designers to create the graphical representation of the IC 508. The interactive design environment 522 comprises an input device 522A and/or an output device 522B. The input device 522B is configured to allow a user to interact with the graphical representation of the IC 508 through the layout design window 506, and in various embodiments may comprise a keyboard, mouse, and/or any other input device. The output device 522B is configured to provide the graphical representation of the IC 508 through the layout design window 506, so that it can be viewed by a user. In various embodiments, the output device 522B may comprise a monitor, for example.

Figure 6:
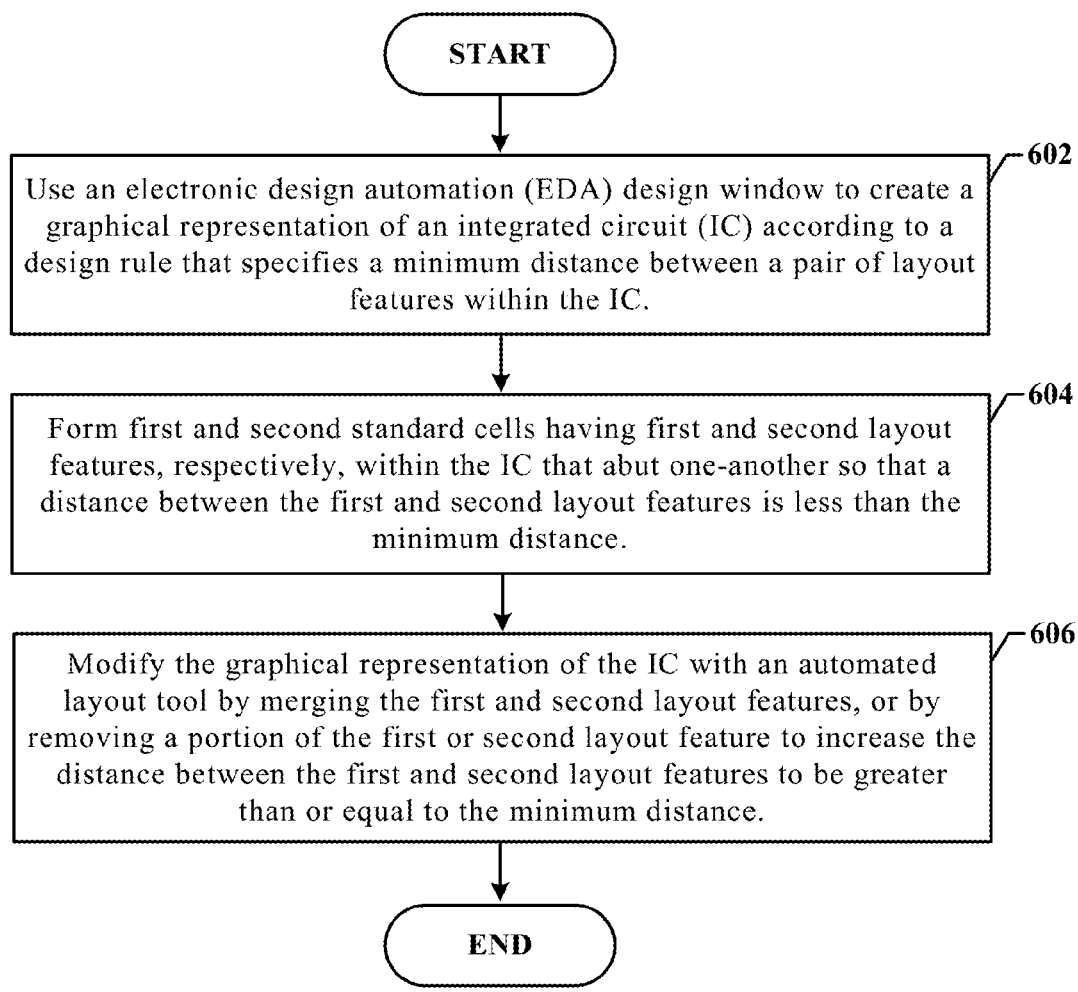
FIGS. 6 and 7 illustrate some embodiments of methods to perform an automated layout modification.

FIG. 6 illustrates some embodiments of a method 600 to perform an automated layout modification.

At 602 an electronic design automation (EDA) design window is used to create a graphical representation of an integrated circuit (IC) according to a design rule that specifies a minimum distance between a pair of layout features within the IC. In some embodiments, design rule fails are identified with a layout verification tool, and located within the graphical representation of the IC. In some embodiments, the layout verification tool is configured to suppress identification of design rule fails in regions of the graphical representation that are covered by the marker shape. In some embodiments, the graphical representation of the IC comprises graphical layout data in CIF, OASIS, GDS, GDSII, or GL1 format.

At 604 first and second standard cells are formed within the IC. The first and second standard cells have first and second layout features, respectively, and abut one-another so that a distance between the first and second layout features is less than the minimum distance. In some embodiments, forming the first and second standard cells comprises forming the first and second layout features on a first design layer, and a covering them with a marker shape formed on a second design layer.

At 606 the graphical representation of the IC is modified with an automated layout tool to increase the distance between the first and second layout features to be greater than or equal to the minimum distance. In some embodiments, the automated layout tool is configured to modify layout features that are formed on the first design layer, fail the design rule, and are covered by the marker shape. In some embodiments, the layout features are modified by removing a portion of the first or second layout feature to increase the distance between the first and second layout features to be greater than or equal to the minimum distance. In some embodiments, the layout features are modified by adding a design feature at a second level of design hierarchy, which is above a first level of design hierarchy of the first and second standard cell layouts.

Figure 7:
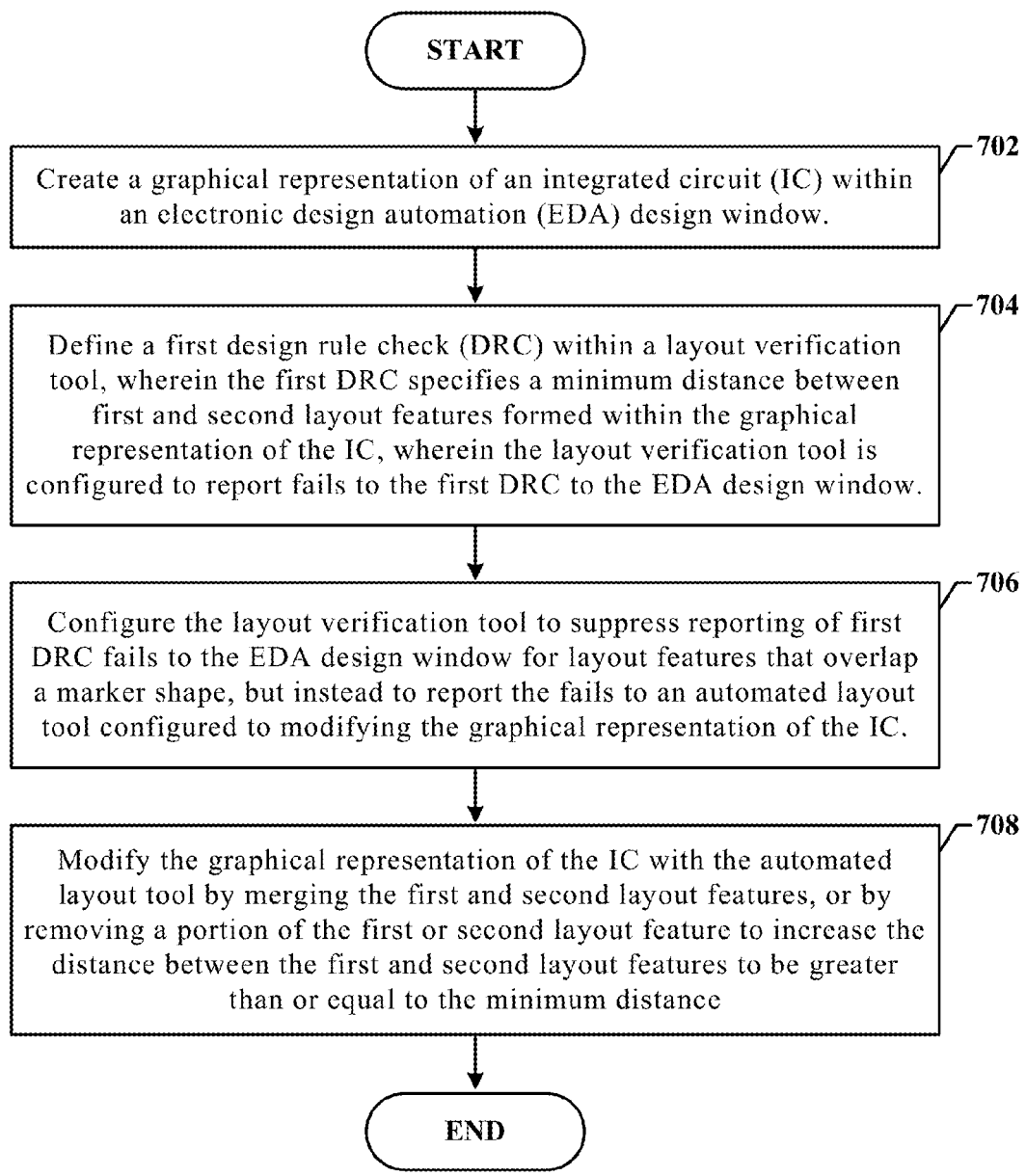

FIG. 7 illustrates some embodiments of a method 700 to perform an automated layout modification.

At 702 a graphical representation of an integrated circuit (IC) is created within an electronic design automation (EDA) design window.

At 704 a first design rule check (DRC) is defined within a layout verification tool, wherein the first DRC specifies a minimum distance between first and second layout features formed within the graphical representation of the IC, wherein the layout verification tool is configured to report fails to the first DRC to the EDA design window.

At 706 the layout verification tool is configured to suppress reporting of first DRC fails to the EDA design window for layout features that overlap a marker shape, but instead to report the fails to an automated layout tool configured to modifying the graphical representation of the IC.

At 708 the graphical representation of the IC is modified with the automated layout tool by merging the first and second layout features, or by removing a portion of the first or second layout feature to increase the distance between the first and second layout features to be greater than or equal to the minimum distance.

In some embodiments, the automated layout tool is configured to merge the first and second layout features if they both connect to a same marker shape that is formed on a manufactured layer, as defined by a cross-sectional device stack of the IC. In some embodiments, the automated layout tool is configured to merge the first and second layout features if one of them is not connected to a manufactured layer (i.e., left "floating"). In some embodiments, the automated layout tool is configured to shift edges of the first and second layout features that face one-another away from one another to so that the resulting distance between the first and second layout features is greater the minimum distance, if the first and second layout features cannot be merged.

In some embodiments, a second DRC is defined that requires contacts that are formed to layout features within a standard cell to be a distance of greater than one-half the minimum distance of the first DRC from a boundary of the standard cell. As a result, the automated layout tool can shift edges of the first or second layout features without uncovering the contact.

In some embodiments, a third DRC is defined that specifies a relaxed distance, which is less than the minimum distance, between first and second contacts that connect to the same marker shape that is formed on a manufactured layer. As a result, the automated layout tool can merge the first and second contacts into a single contact.

Therefore, some embodiments of the present disclosure relate to a method of hierarchical layout design, comprising forming a layout of an integrated circuit (IC) according to a design rule that specifies a minimum design rule distance between a pair of layout features within the IC. Forming the layout comprises forming first and second standard cells having first and second layout features, respectively, that about one-another so that a distance between the first and second layout features is less than the minimum design rule distance. The method further comprises configuring design rule checking (DRC) to ignore this fail. Instead, the layout is modified with an automated layout tool by merging the first and second layout features, or by removing a portion of the first or second layout feature to increase the distance between the first and second layout features to be greater than or equal to the minimum distance. Consequently, the drive current and/or resistivity of a semiconducting device formed in a boundary region between the first and second standard cells can be made to scale with the size of the standard cell.

Some embodiments relate to a method, comprising using an electronic design automation (EDA) design window to create a graphical representation of an integrated circuit (IC) according to a design rule that specifies a minimum distance between a pair of layout features within the IC. The method further comprises forming first and second standard cells having first and second layout features, respectively, within the IC that abut one-another so that a distance between the first and second layout features is less than the minimum distance. The method also comprises modifying the graphical representation of the IC with an automated layout tool by merging the first and second layout features, or by removing a portion of the first or second layout feature to increase the distance between the first and second layout features to be greater than or equal to the minimum distance.

Other embodiments relate to a method, comprising creating a graphical representation of an integrated circuit (IC) within an electronic design automation (EDA) design window. The method further comprises defining a first design rule check (DRC) within a layout verification tool, wherein the first DRC specifies a minimum distance between first and second layout features formed within the graphical representation of the IC, wherein the layout verification tool is configured to report fails to the first DRC to the EDA design window. The method further comprises configuring the layout verification tool to suppress reporting of first DRC fails to the EDA design window for layout features that overlap a marker shape, but instead to report the fails to an automated layout tool configured to modifying the graphical representation of the IC. The method also comprises modifying the graphical representation of the IC with the automated layout tool by merging the first and second layout features, or by removing a portion of the first or second layout feature to increase the distance between the first and second layout features to be greater than or equal to the minimum distance.

Still other embodiments relate to an electronic design automation (EDA) tool arrangement, comprising a design window configured to create a graphical representation of an integrated circuit (IC). The EDA tool arrangement further comprises a design rule check (DRC) generation element configured to generate first and second sets of design rules that specify different requirements for placement of layout features within the graphical representation of the IC. The EDA tool arrangement further comprises a layout verification tool, coupled to the design window, and configured to verify whether the graphical representation of the IC satisfies the first and second sets of design rules and report fails to the design window. The EDA tool arrangement also comprises an automated layout tool, coupled to the design window and to the layout verification tool, and configured to modify layout features of the graphical representation by merging layout features, or removing portions of layout features that do not satisfy the first or second set of design rules.

While methods 600 and 700 have been described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Further, spatially relative terms, such as "over," "on," "beneath," "below," "lower," "above," "upper" and the like, have been used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    using an electronic design automation (EDA) design window displayed on a monitor to create a graphical representation used to form an integrated circuit (IC);
    forming first and second standard cells within the graphical representation, which respectively have first and second layout features, wherein the first and second standard cells abut along a cell boundary so that the first and second layout features are separated over the cell boundary by a non-zero distance that is less than a minimum distance defined by a design rule; and
    automatically modifying the first and second layout features by merging the first and second layout features to extend over the cell boundary so that the first and second layout features are not separated by a distance that is less than the minimum distance.

2. The method of claim 1, wherein the first and second layout features are formed on a first design layer, and further comprising:
    covering a boundary region over abutted edges of the first and second standard cells with a marker shape formed on a second design layer; and
    modifying layout features that are formed on the first design layer, fail the design rule, and are covered by the marker shape.

3. The method of claim 2, further comprising:
    identifying a design rule fail with a layout verification tool, wherein the layout verification tool is configured to ignore identification of design rule fails in regions of the graphical representation of the IC that are covered by the marker shape.

4. The method of claim 1, wherein the first and second layout features both comprise cut shapes, and wherein the merging removes portions of the first and second layout features that the cut shapes overlap.

5. The method of claim 1, further comprising:
    removing portions of the merged first and second layout features so that a resulting merged shape comprises an area of a single contact, or a total combined area of both contacts.

6. The method of claim 1, wherein the first or second layout feature comprises an active area of a semiconductor device, a metal layer configured to connect to the semiconductor device, or a contact that connects the semiconductor device to the metal layer.

7. The method of claim 1, wherein modifying the graphical representation of the IC further comprises adding a design feature at a second level of design hierarchy, which is above a first level of design hierarchy of the first and second standard cells.

8. The method of claim 1, wherein the graphical representation of the IC comprises graphical layout data in CIF, OASIS, GDS, GDSII, or GL1 format.

9. The method of claim 1, further comprising:
forming a blocking marker shape over the cell boundary, wherein the blocking marker shape has ends that abut ends of the first and second layout features; and
wherein the merging of the first and second layout features is in a space underlying the blocking marker shape.

10. The method of claim 1, wherein merging the first and second layout features comprises:
removing a portion of the first or second layout feature to increase the distance between the first and second layout features to be greater than or equal to the minimum distance.

11. The method of claim 10, further comprising:
not removing portions of layout features covered by a contact.

12. The method of claim 1, wherein modifying the first or second layout features comprises:
shifting edges of the first and second layout features that face one-another away from one another so that a resulting distance between the first and second layout features is greater than the minimum distance.

13. An electronic design automation (EDA) tool arrangement, comprising:
a design window, displayed on a monitor, configured to create a graphical representation used to form an integrated circuit (IC);
an automated layout tool, coupled to the design window and configured to:
form first and second standard cells within the graphical representation, which respectively have first and second layout features, wherein the first and second standard cells abut along a cell boundary so that the first and second layout features are separated over the cell boundary by a non-zero distance that is less than a minimum distance defined by a design rule; and
automatically modify the first or second layout feature so that the first and second layout features are not separated by a distance that is less than the minimum distance by merging the first and second layout features to form a single layout feature that extends over the cell boundary.

14. The EDA tool arrangement of claim 13, further comprising a layout verification tool is configured to:
report fails to a first set of design rules to the design window for layout features that are not covered by a marker shape;
report fails to a second set of design rules to the design window for layout features that are covered by the marker shape; and
report fails to the first set of design rules to the automated layout tool for layout features that are covered by the marker shape.

15. The EDA tool arrangement of claim 14, wherein the automated layout tool is configured to modify layout features that are covered by the marker shape that fail the first set of design rules so that they satisfy the first set of design rules.

16. A method, comprising:
providing an electronic design automation (EDA) design window displayed on a monitor to create a graphical representation used to form an integrated circuit (IC);
forming a first layout feature within a first standard cell located in the graphical representation used to form an integrated circuit (IC);
forming a second layout feature within a second standard cell located in the graphical representation, wherein the first and second standard cells abut along a cell boundary so that the first and second layout features are separated by a non-zero distance that is less than a minimum distance defined by a design rule; and
automatically merging the first and second layout features to form a single layout feature that extends over the cell boundary, thereby eliminating a distance between the first layout feature and the second layout feature that is less than the minimum distance.

17. The method of claim 16, further comprising:
forming a blocking marker shape over the cell boundary, wherein the blocking marker shape has ends that abut ends of the first and second layout features; and
merging the first and second layout features in a space underlying the blocking marker shape.

18. The method of claim 16, further comprising:
identifying a design rule fail based on the design rule with a layout verification tool, wherein the layout verification tool is configured to ignore identification of design rule fails in regions of the graphical representation of the IC that are covered by a marker shape.

19. The method of claim 16, further comprising:
removing portions of the merged first and second layout features so that a resulting merged shape comprises an area of a single contact or a total combined area of both contacts.

20. The method of claim 16, wherein the first or second layout feature comprises an active area of a semiconductor device, a metal layer configured to connect to the semiconductor device, or a contact that connects the semiconductor device to the metal layer.

* * * * *